United States Patent
Chung et al.

(10) Patent No.: US 7,603,096 B2
(45) Date of Patent: Oct. 13, 2009

(54) MIXER WITH SELF-CALIBRATING CARRIER LEAKAGE MECHANISM

(75) Inventors: Yuan-Hung Chung, Jhudong Township, Hsinchu County (TW); Jie-Wei Lai, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 167 days.

(21) Appl. No.: 11/675,688

(22) Filed: Feb. 16, 2007

(65) Prior Publication Data

US 2008/0200135 A1    Aug. 21, 2008

(51) Int. Cl.
*H04B 1/06* (2006.01)
*H04B 7/00* (2006.01)

(52) U.S. Cl. .............. 455/262; 455/232.1; 361/93.1; 330/252

(58) Field of Classification Search ........... 455/262, 455/232.1, 109, 318; 361/93.1, 56; 330/252, 330/258, 261
See application file for complete search history.

(56) References Cited

U.S. PATENT DOCUMENTS

| | | | | |
|---|---|---|---|---|
| 7,002,412 | B2* | 2/2006 | Li | 330/252 |
| 7,027,793 | B2* | 4/2006 | Gard et al. | 455/318 |
| 7,193,466 | B2* | 3/2007 | Kim et al. | 330/258 |
| 2003/0045249 | A1 | 3/2003 | Nielsen | |
| 2003/0169827 | A1 | 9/2003 | Shi et al. | |
| 2003/0186664 | A1* | 10/2003 | Shah | 455/232.1 |
| 2004/0132424 | A1 | 7/2004 | Aytur et al. | |
| 2004/0252434 | A1* | 12/2004 | Mori et al. | 361/93.1 |
| 2005/0141634 | A1 | 6/2005 | Lin | |
| 2005/0191974 | A1* | 9/2005 | Pan | 455/109 |
| 2006/0126238 | A1* | 6/2006 | Goudo | 361/56 |
| 2008/0106337 | A1* | 5/2008 | Lin | 330/261 |

OTHER PUBLICATIONS

"A 2.4GHz CMOS Transceiver and Baseband Processor Chipset for 802.11b Wireless LAN Application" Chien et al., 2003.

* cited by examiner

*Primary Examiner*—Edward Urban
*Assistant Examiner*—Christian A Hannon
(74) *Attorney, Agent, or Firm*—Thomas, Kayden, Horstemeyer & Risley

(57) ABSTRACT

An embodiment of a mixer with carrier leakage self-calibrating is disclosed. The mixer comprises a double balanced mixer, a gm stage comprising a first processing unit and a second processing unit, a current duplicating circuit, a capacitor, a controller and a current compensation unit. The current duplicating circuit selects the first processing unit or the second processing unit and duplicates a duplicated current of the selected processing unit to charge the capacitor. The capacitor has a first terminal and a second terminal, wherein the second terminal is grounded and the first terminal receives the duplicated current. The controller determines a charge time of the capacitor to generate a compensation signal, wherein the charge time is the time that the voltage of the capacitor is charged to equal to a reference voltage. The current compensation unit receives the compensation signal to generate a compensation current to the mixer.

29 Claims, 12 Drawing Sheets

MIXER WITH SELF-CALIBRATING CARRIER LEAKAGE MECHANISM

BACKGROUND OF THE INVENTION

1. Field of the Invention

The invention relates to a mixer and more particularly to a mixer with a self-calibrating carrier leakage mechanism.

2. Description of the Related Art

Wireless communication has been widely applied in various applications. Typically, each wireless communication device requires a radio transceiver (i.e., a receiver and a transmitter). With the demand for enhanced performance, a direct conversion technology has been developed for size, cost and lower power consumption. In direct conversion transmitters, however, LO pulling, RF carrier leakage due to I-Q DC offset, and I-Q gain/phase imbalance problems must be overcome.

FIG. 1 is a circuit diagram illustrating the leakage current effect on the modulator outputs. Input stage 11 provides two differential input signals, Vp and Vn, to the gm stage 13. The local oscillator generates two differential signals at a carrier frequency. During the direct conversion modulation process, the carrier power is theoretically completely eliminated. But, in real practice, complete elimination is difficult to achieve. The unwanted carrier power, referred to as local oscillator leakage, reduces the performance of the mixer 12. When the bias currents of M1 and M2 are mismatched, the differential local oscillator signals, Lon and Lop, leak to the modulator output, RFoutp or RFoutn. Assuming the bias current of transistor M1 is (I+Δi), the bias current of transistor M2 is (I−Δi), the local oscillator signal LOn is $-A_{LO}\cos(\omega_{LO}t)$, and the local oscillator signal LOp is $A_{LO}\cos(\omega_{LO}t)$, hence $$RFoutp = \{LOp(I + \Delta i) + LOn(I - \Delta i)\} \cdot L_{load}$$

$$= 2\Delta i \cdot A_{LO}\cos(\omega_{LO}t) \cdot L_{load}.$$

It is apparent that the output signal of the mixer 12 comprises unwanted term, $A_{LO}\cos(\omega_{LO}t)$, from the differential local oscillator signal LOp. For better performance, the carrier leakage should be minimized, thus, a calibration unit for reducing the Δi is desirable.

FIG. 2 illustrates a carrier leakage calibration system disclosed in U.S. Patent Application Publication US2004/0132424. The leakage detector 22 receives the output signal of direct up transmitter 21 as a feedback signal, detects carrier leakage, and transmits the detection result to the correction algorithm 23. The correction algorithm 23 receives the detection result from the leakage detector 22 to generate a digital value to the digital to analog converters (DAC) 24 and 25. The DACs 24 and 25 respectively outputs compensation in-phase modulation signal Io(t) and compensation quadrature modulation signal Qo(t) to in-phase modulation signal I(t) and quadrature modulation signal Q(t) to achieve the carrier leakage calibration.

FIG. 3 is a block diagram of a direct up-conversion transmitter with a compensation feedback path in U.S. Patent Application Publication US2003/0045249. The impairment detector 31 measures signal impairments in the direct up-converter output 33 and generates a feedback signal 34 to the impairment compensator 32. The baseband processor 35 generates in-phase (I) and quadrature-phase (Q) digital baseband signals for RF transmission. The I and Q baseband signals are modified prior to analog conversion by the impairment compensator 32. The modified baseband signals are then converted into the analog domain by the DACs 36. The direct up-converter 33 which combines the analog baseband signals with an RF carrier signal 37 from the frequency synthesizer 38. The feedback signal 34 is used by the impairment compensator 32 to pre-distort the I and Q baseband signals such that the pre-distortion cancels any actual distortion caused by impairments in the direct up-converter 33.

BRIEF SUMMARY OF THE INVENTION

Mixers with self-calibrating carrier leakage are provided. An exemplary embodiment of a mixer with self-calibrating carrier leakage comprises a double balanced mixer, a gm stage comprising a first processing unit and a second processing unit, a current duplicating circuit, a capacitor, a controller and a current compensation unit. The current duplicating circuit selects the first processing unit or the second processing unit and duplicates a duplicated current of the selected processing unit to charge the capacitor. The capacitor has a first terminal and a second terminal, wherein the second terminal is grounded and the first terminal receives the duplicated current. The controller determines a charge time of the capacitor to generate a compensation signal, wherein the charge time is the time that the voltage of the capacitor is charged to equal to a reference voltage. The current compensation unit receives the compensation signal to generate a compensation current to the mixer.

An embodiment of a method for calibrating carrier leakage in a mixer comprising a switching stage and a gm stage is provided. The method comprises turning off the switching stage; initializing a carrier leakage detection unit; duplicating a duplicated current from the gm stage; charging a capacitor by the duplicated current; counting a charge time that the voltage of the capacitor is charged to equal to a reference voltage; determining a compensation current based on the charging time.

An embodiment of a method for calibrating carrier leakage in a mixer comprising a switching stage and a gm stage is provided. The method comprises turning off the switching stage; selecting the first processing unit; duplicating a first current from the first processing unit; starting charging a capacitor by the first current and starting up-counting a first count value; stopping up-counting in response to the capacitor to be fully charged; discharging the capacitor; selecting the second processing unit; duplicating a second current from the second processing unit; beginning to charge the capacitor by the second current and starting the countdown from first count value; stopping the countdown in response to the capacitor to be fully charged; acquiring a residual count value; generating a compensation current based on the residual count value.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
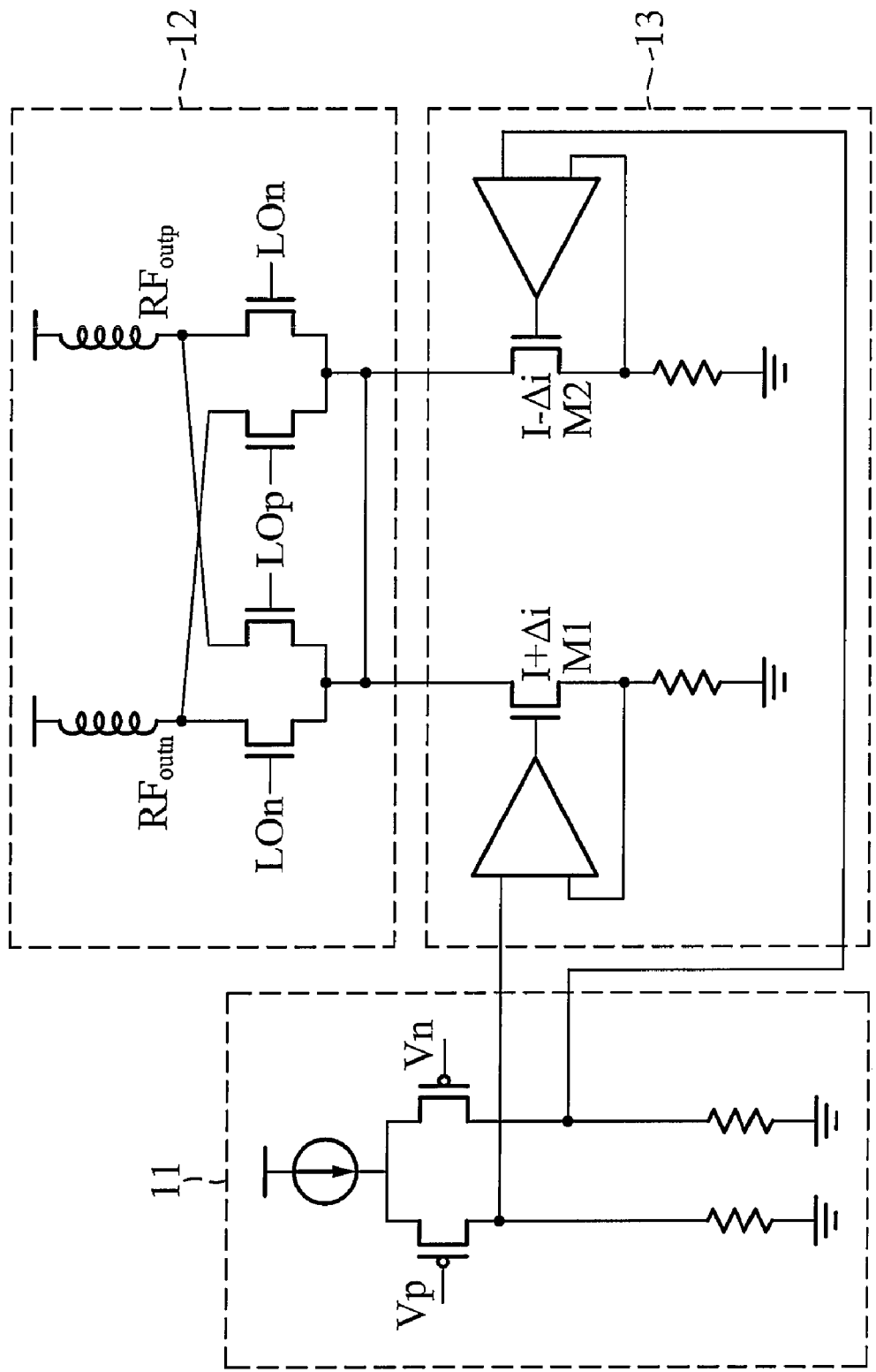
FIG. 1 is a circuit diagram illustrating leakage current effect on the modulator outputs.
Figure 2:
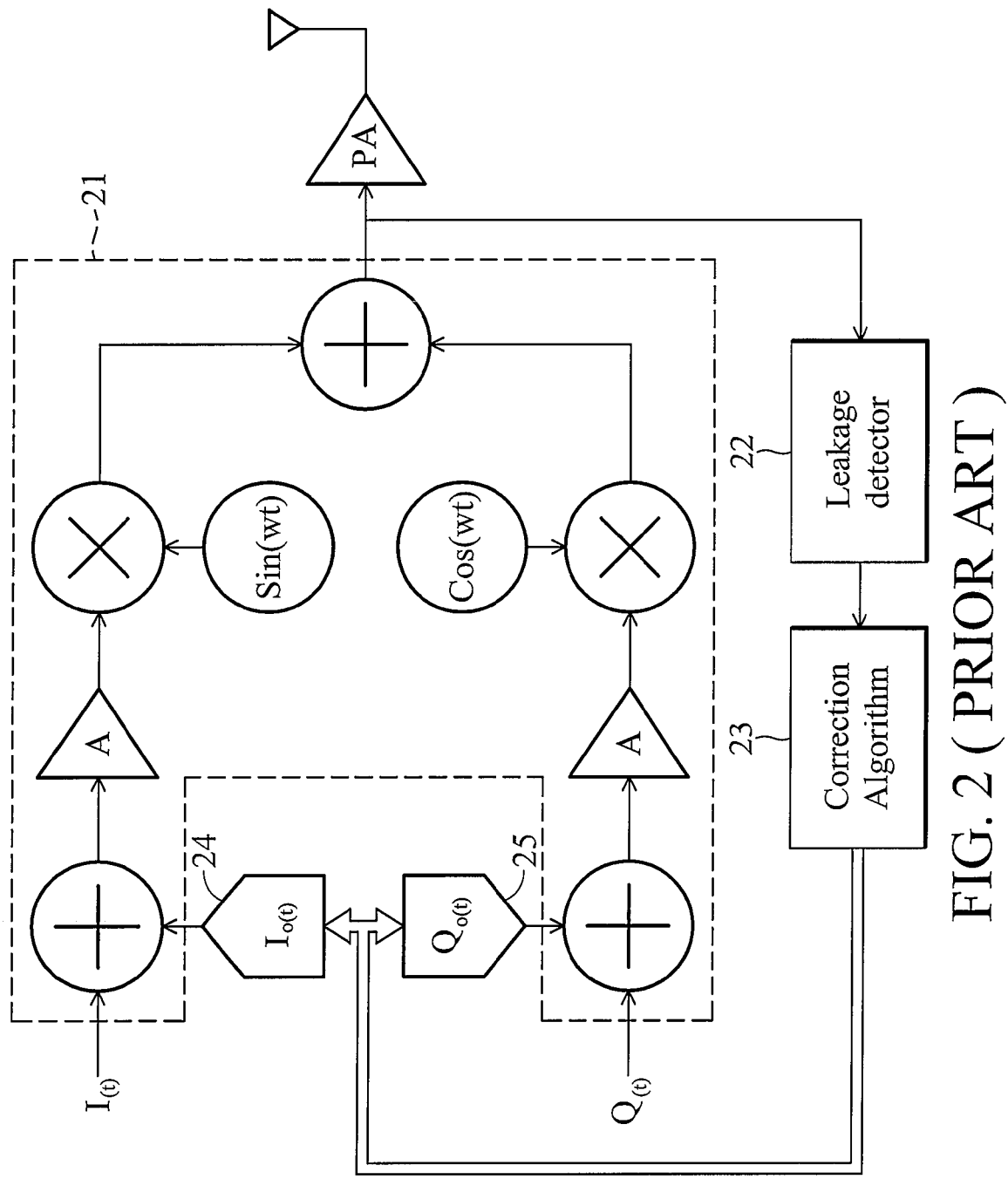
FIG. 2 illustrating a carrier leakage calibration system disclosed in U.S. Patent Application Publication US2004/0132424.
Figure 3:
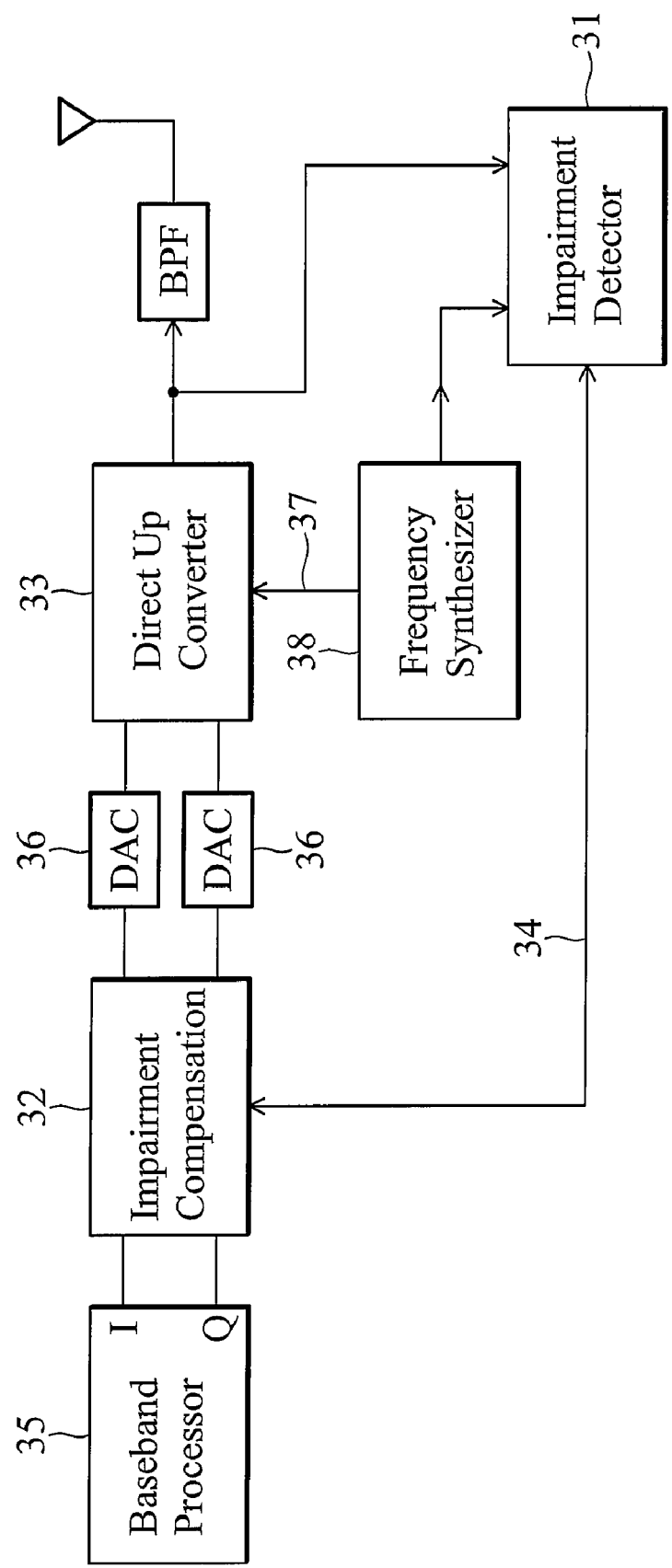
FIG. 3 is a block diagram of a direct up-conversion transmitter with a compensation feedback path disclosed in U.S. Patent Application Publication US2003/0045249.
Figure 4:
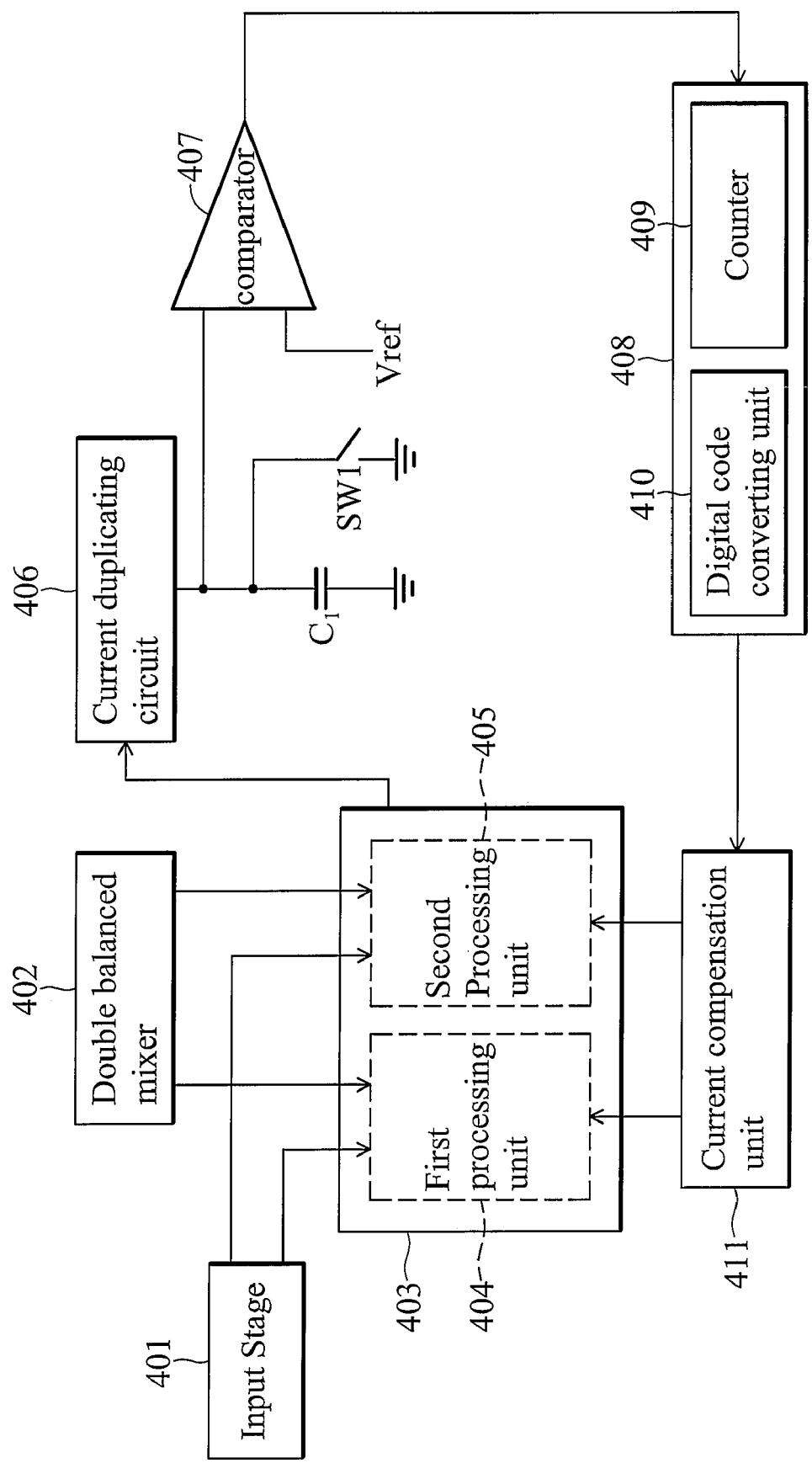
FIG. 4 is a block diagram illustrating an embodiment of a mixer with carrier leakage calibrating mechanism.

FIG. 4 is a block diagram illustrating an embodiment of a mixer with carrier leakage calibrating mechanism. The input stage 401 generates and transmits a pair of differential signals to the gm stage 403. The gm stage 403 is further coupled to a double balanced mixer 402 (or called switching stage). The gm stage comprises a first processing unit 404 and a second processing unit 405. The double balanced mixer 402 is turned off in response to the carrier leakage calibrating mechanism works. The current duplicating circuit 406 duplicates a first current from the first processing unit 404 or a second current from the second processing unit 405 to charge the capacitor $C_1$. The comparator 407 has a first input terminal coupled between the current duplicating circuit 406 and the capacitor $C_1$, a second input terminal receiving a reference voltage Vref and an output terminal. When a carrier leakage calibration begins, the capacitor $C_1$ is discharged and the capacitor 407 outputs a start-counting signal to the controller 408 in response to full discharge of the capacitor $C_1$. When the capacitor $C_1$ is fully charged, the comparator 407 outputs a stop-counting signal to the controller 408 and the switch SW1 makes an electrical connection between the capacitor $C_1$ and ground to discharge the capacitor $C_1$. The controller 408 comprises a counter 409 and a digital code converting unit 410. The counter 409 starts counting in response to the start-counting signal and stops counting in response to the stop-counting signal. When the counter 409 stops counting, a count value is generated and transmitted to the digital code converting unit 410 to generate a digital code. The current compensation unit 411 generates and injects corresponding compensation current to the first processing unit 404 or the second processing unit 405 based on the digital code.

In one example, the capacitor $C_1$ is respectively charged by the first current and the second current to acquire a first count value and a second count value. The first count value corresponds to a first charge time that the capacitor is charged to the reference voltage by the first current, and the second count value corresponds to a second charge time that the capacitor is charged to the reference voltage by the second current. The counter 409 generates and transmits a difference value between the first count value and the second count value to the digital code converting unit 410. The current compensation unit 411 generates and injects corresponding compensation current to the first processing unit 404 or the second processing unit 405 based on the difference value. In other words, the compensation current varies according to the first charge time and the second charge time. In another example, the counter 409 up-counting the first charge time to acquire the first count value and down-counting the second charge time from the first count value to acquire a residual value. The current compensation unit 411 then generates the compensation current based on the residual value.

Figure 5:
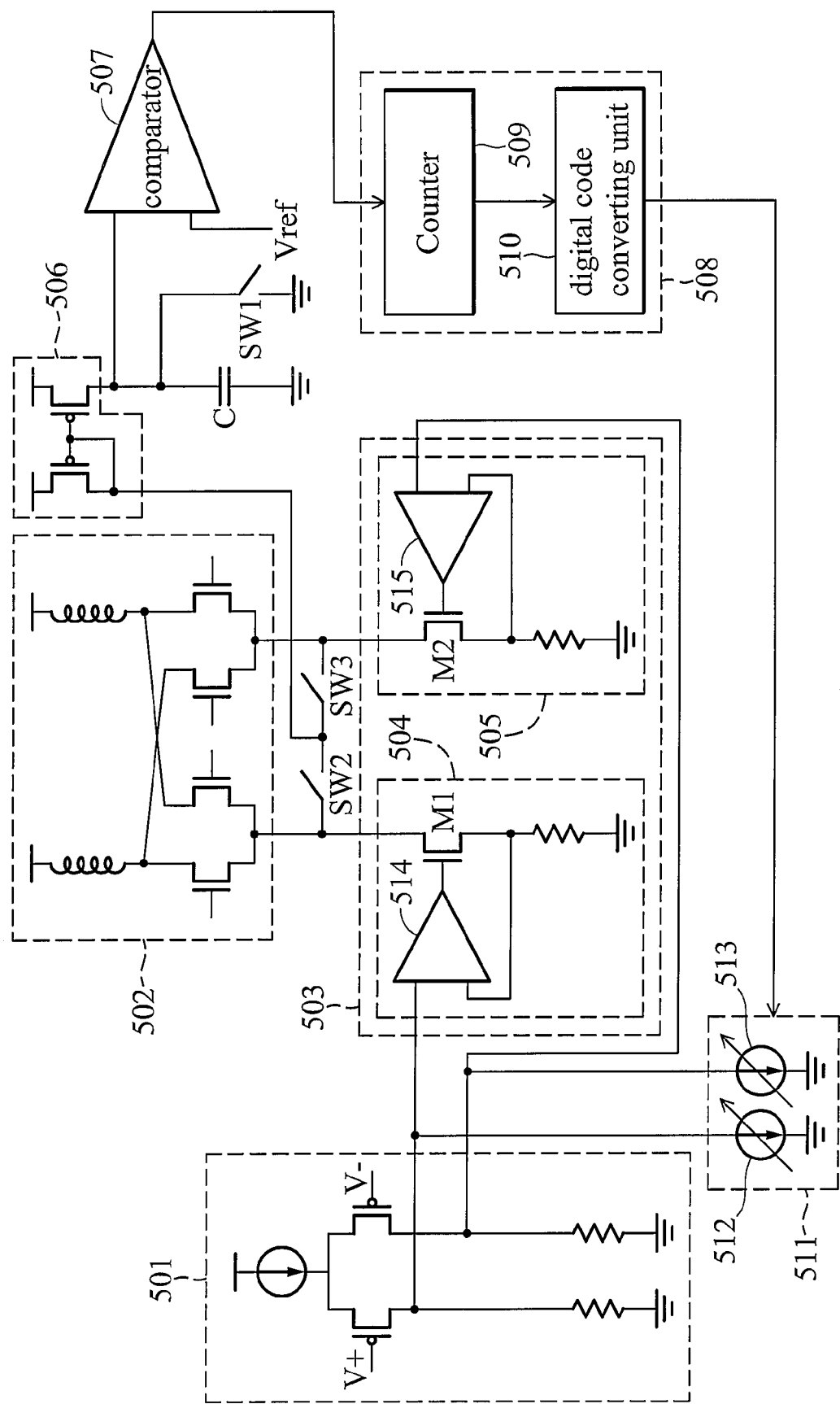
FIG. 5 is a circuit diagram illustrating another embodiment of a mixer with carrier leakage calibrating mechanism.

FIG. 5 is a circuit diagram illustrating another embodiment of a mixer with carrier leakage calibrating mechanism. The input stage 501 generates and transmits a pair of differential signals to the gm stage 503. The gm stage 503 is further coupled to a switching stage 502. The gm stage 503 comprises a first processing unit 504 and a second processing unit 505. A second switch SW2 and a third switch SW3 are respectively coupled to the first processing unit 504 and the second processing unit 505. In this embodiment, when a carrier leakage calibrating mechanism is activated, only one of the second switches SW2 and the third switch SW3 is turned on. Furthermore, the switching stage 502 is turned off in response to the carrier leakage calibrating mechanism begins working. The current mirror 506 duplicates a first current from the first processing unit 504 or a second current from the second processing unit 505 to charge the capacitor C through the output of the current mirror 506. The capacitor C has a first terminal coupled to the output of the current mirror 506 and a second terminal grounded. The first comparator 507 has a first input terminal coupled to the output of the current mirror 506, a second input terminal receiving a reference voltage Vref, and an output terminal coupled to a controller 508. When charging of the capacitor C begins, the first comparator 507 sends a start-counting signal to the controller 508 to count the charge time. Moreover, the capacitor C should be fully discharged before being charged by the current from the gm stage 503. The first switch SW1 has a first terminal coupled to the first terminal of the capacitor C and a second terminal grounded. When the capacitor is fully charged, i.e. the voltage of the first terminal of the capacitor C is equal to the reference voltage Vref, the first switch SW1 is turned on to discharge the capacitor C and the comparator sends a stop-counting signal to the controller 508. The controller determines and converts the charge time to a digital code that is transmitted to the current compensation unit 511 to generate the compensation current.

In one example, the capacitor C is respectively charged by the first current and the second current. A charging and discharging procedure is applied to the capacitor C. First, the capacitor C is fully discharged. Second, the capacitor C is charged by the first current and a first count value corresponding to a first charge time is acquired. Third, the capacitor C is fully discharged again. Fourth, the capacitor C is charged by the second current and a second count value corresponding to a second charge time is acquired. The current compensation unit 511 generates the compensation current based on the first charge time and the second charge time.

The controller 508 comprises a counter 509 and a digital code converting unit 510. The counter 509 operates based on a reference clock signal (not shown in FIG. 5) to generate the first count value and the second count value. The digital code converting unit 510 receives and converts the received first count value or second count value to a first digital code or a second digital code. The current compensation unit 511 generates the compensation current based on the first digital code or the second digital code. In one example, when the carrier leakage calibrating mechanism is activated, the digital code converting unit 510 transmits an initial code to the current compensation unit 511 to generate the compensation current. In another example, the counter 509 first up-counts the first charge time to acquire the first count value and counts down the second charge time from the first count value to acquire a residual value. The current compensation unit 511 then generates the compensation current based on the residue value.

The current compensation unit 511 comprises two digital controlled current generators, a first current generator 512 and a second generator 513, respectively coupled the first processing unit 504 and the second processing unit 505. In one example, the first current generator 512 and the second generator 513 are digital to analog converters (DAC). The first processing unit 504 comprises a second comparator 514, a first transistor M1 and a loader (not labeled). The second comparator 514 has a first input terminal receiving the differential signal from the input stage 501, a second input terminal and an output terminal. The first transistor M1 has a control terminal coupled to the output terminal of the second comparator 514, an input terminal coupled to the switching stage 502 and an output terminal coupled to the loader. The second processing unit 505 comprises a second comparator 514, a second transistor M2 and a second loader (not labeled). The third comparator 515 has a first input terminal receiving the differential signal from the input stage 501, a second input terminal and an output terminal. The second transistor M2 has a control terminal coupled to the output terminal of the third comparator 515, an input terminal coupled to the switching stage 502 and an output terminal coupled to the second loader. When the current compensation unit 511 outputs the compensation current to the second comparator 514 and the third comparator 515, the voltage of output terminals of the second comparator 514 and the third comparator 515 changes and the currents passing through the first transistor M1 and the second transistor M2 also change, thus, the current mismatch between the first transistor M1 and the second transistor M2 can be reduced.

Figure 6:
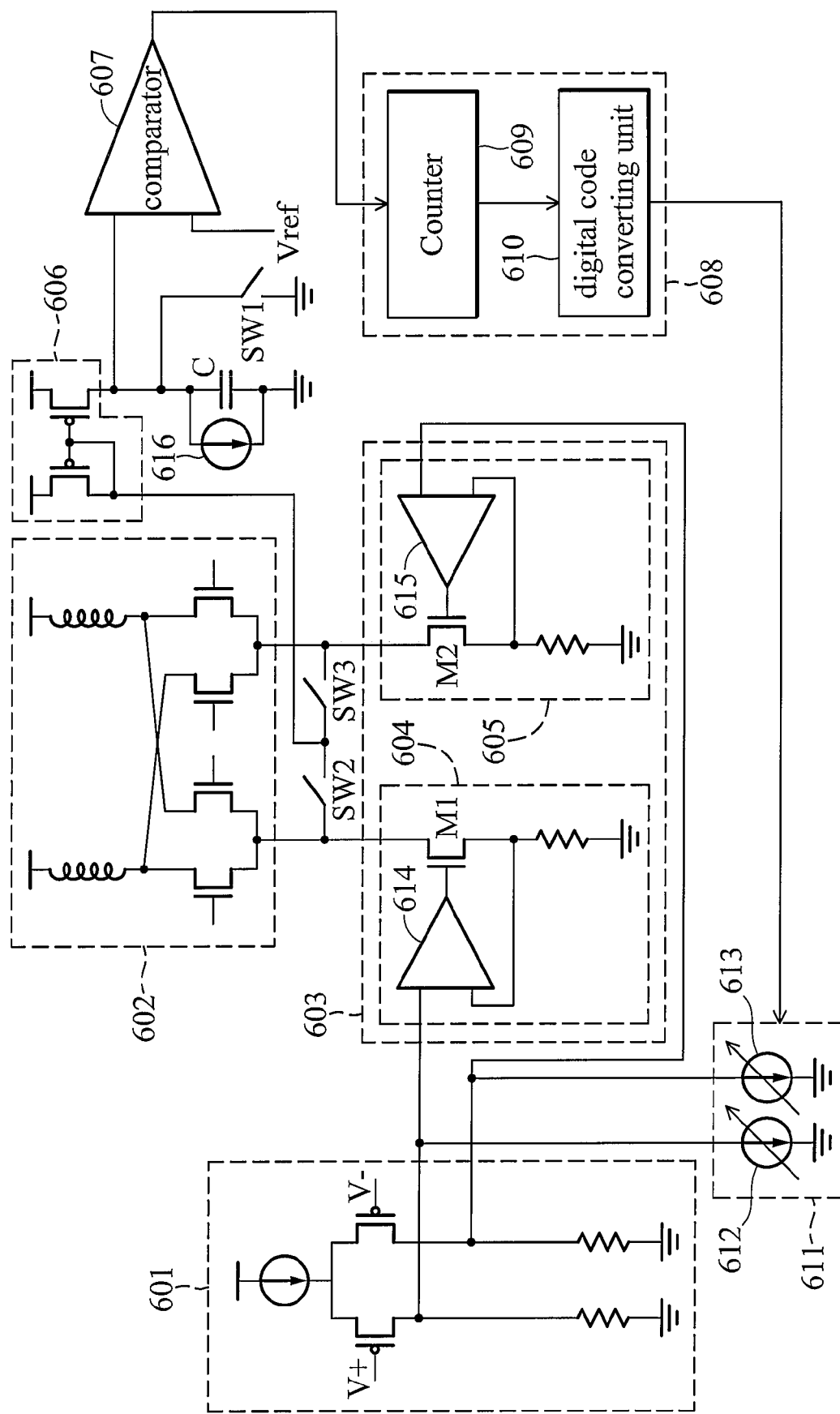
FIG. 6 is a circuit diagram illustrating another embodiment of a mixer with carrier leakage calibrating mechanism.

FIG. 6 is a circuit diagram illustrating another embodiment of a mixer with carrier leakage calibrating mechanism. The input stage 601 generates and transmits a pair of differential signals to the gm stage 603. The gm stage 603 comprises a first processing unit 604 and a second processing unit 605. The first processing unit 604 comprises a second comparator 614, a first transistor M1 and a first loader (not labeled). The second comparator 614 has a first input terminal receiving the differential signal from the input stage 601, a second input terminal and an output terminal. The first transistor M1 has a control terminal coupled to the output terminal of the second comparator 614, an input terminal coupled to the switching stage 602 and an output terminal coupled to the first loader. The second processing unit 605 comprises a second comparator 614, a second transistor M2 and a second loader (not labeled). The third comparator 615 has a first input terminal receiving the differential signal from the input stage 601, a second input terminal and an output terminal. The second transistor M2 has a control terminal coupled to the output terminal of the third comparator 615, an input terminal coupled to the switching stage 602 and an output terminal coupled to the second loader.

A second switch SW2 has a first terminal coupled to the input terminal of the first transistor M1 and a second terminal. A third switch SW3 has a first terminal coupled to the second terminal of the second switch SW2 and a second terminal coupled to the input terminal of the second transistor M2. In this embodiment, when the carrier leakage calibrating mechanism is activated, only the second switch SW2 or the third switch SW3 is turned on. Furthermore, the switching stage 602 is turned off in response to the carrier leakage calibrating mechanism beginning to work.

The current mirror 606 duplicates a first current from the first processing unit 604 or a second current from the second processing unit 605 to charge the capacitor C through the output of the current mirror 606. The capacitor C has a first terminal coupled to the output of the current mirror 606 and a second terminal grounded. The first comparator 607 has a first input terminal coupled to the output of the current mirror 606, a second input terminal receiving a reference voltage Vref, and an output terminal coupled to a controller 608. When the capacitor C begins charging, the first comparator 607 sends a start-counting signal to the controller 608 to count the charge time. Moreover, the capacitor C should be fully discharged before being charged by the current from the gm stage 603. The first switch SW1 has a first terminal coupled to the first terminal of the capacitor C and a second terminal grounded. When the capacitor is fully charged, i.e. the voltage of the first terminal of the capacitor C is equal to the reference voltage Vref, the first switch SW1 is turned on to discharge the capacitor C and the comparator sends a stop-counting signal to the controller 608. Then, the controller determines and converts the charge time to a digital code that is transmitted to the current compensation unit 611 to generate the compensation current.

In FIG. 6, a current generator 616 is connected in parallel to the capacitor C. If the capacitance of the capacitor C is too large and the charge current is not large enough, the charge time may increase and cause unexpected delay. Thus, the current generator 616 of the embodiment of the present invention can provide a fixed current to charge the capacitor C to reduce the charge time. On the other hand, in some situation, the current generator 616 can also provide a negative fixed current to charge the capacitor C to increase the charge time. The increased charge time can make the current compensation unit 613 to generate more precise compensation current.

In one example, the capacitor C is respectively charged by the first current and the second current. A charging and discharging procedure is applied to the capacitor C. First, the capacitor C is fully discharged. Second, the capacitor C is charged by the first current and a first count value corresponding to a first charge time is acquired. Third, the capacitor C is fully discharged again. Fourth, the capacitor C is charged by the second current and a second count value corresponding to a second charge time is acquired. The current compensation unit 611 generates the compensation current based on the first charge time and the second charge time.

The controller 608 comprises a counter 609 and a digital code converting unit 610. The counter 609 operates based on a reference clock signal (not shown in FIG. 6) to generate the first count value and the second count value. The digital code converting unit 610 receives and converts the received first count value or second count value to a first digital code or a second digital code. The current compensation unit 611 generates the compensation current based on the first digital code or the second digital code. In one example, when the carrier leakage calibrating mechanism is activated, the digital code converting unit 610 transmits an initial code to the current compensation unit 611 to generate the compensation current. In another example, the counter 609 first up-counting the first charge time to acquire the first count value and down-counting the second charge time from the first count value to acquire a residual value. Then, the current compensation unit 611 generates the compensation current based on the residue value.

The current compensation unit 611 comprises two digital controlled current generators, a first current generator 612 and a second generator 613, respectively coupled to the first processing unit 604 and the second processing unit 605. In one example, the first current generator 612 and the second generator 613 are digital to analog converters (DAC). The first processing unit 604 comprises a second comparator 614, a first transistor M1 and a loader (not labeled). The second comparator 614 has a first input terminal receiving the differential signal from the input stage 601, a second input terminal and an output terminal. The first transistor M1 has a control terminal coupled to the output terminal of the second comparator 614, an input terminal coupled to the switching stage 602 and an output terminal coupled to the loader. The second processing unit 605 comprises a second comparator 614, a second transistor M2 and a second loader (not labeled). The third comparator 615 has a first input terminal receiving the differential signal from the input stage 601, a second input terminal and an output terminal. The second transistor M2 has a control terminal coupled to the output terminal of the third comparator 615, an input terminal coupled to the switching stage 602 and an output terminal coupled to the second loader. When the current compensation unit 611 outputs the compensation current to the second comparator 614 and the third comparator 615, the voltage of output terminals of the second comparator 614 and the third comparator 615 changes and the currents passing through the first transistor M1 and the second transistor M2 also change, thus, the current mismatch between the first transistor M1 and the second transistor M2 can be reduced.

Figure 7:
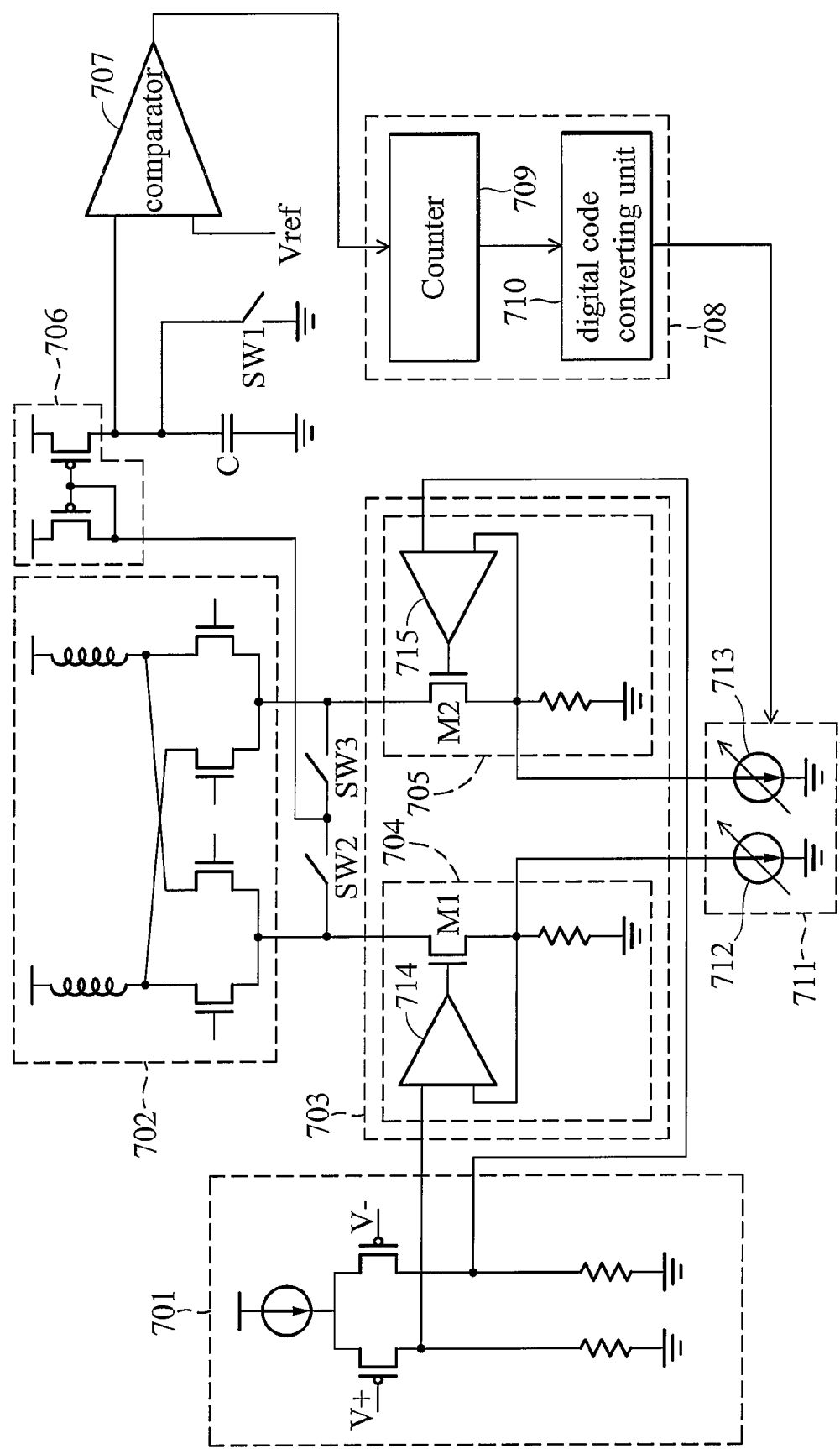
FIG. 7 is a circuit diagram illustrating another embodiment of a mixer with carrier leakage calibrating mechanism.
Figure 8:
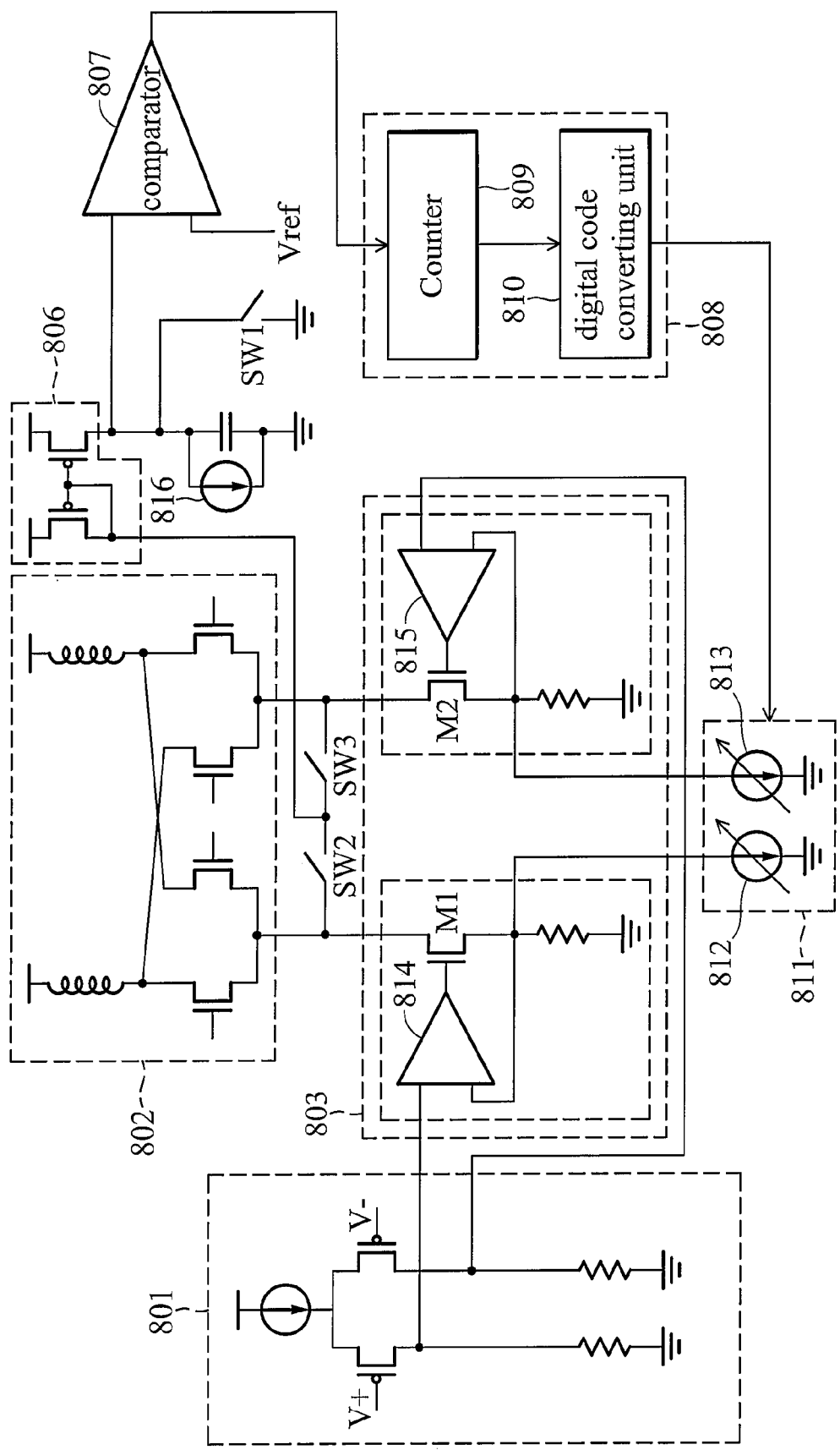
FIG. 8 is a circuit diagram illustrating another embodiment of a mixer with carrier leakage calibrating mechanism.

FIG. 7 and FIG. 8 are a circuit diagrams illustrating another embodiment of a mixer with carrier leakage calibrating mechanism. The operation and connection in FIG. 7 and FIG. 8 are respectively similar to FIG. 5 and FIG. 6. The only difference between them is the arrangement of the current compensation unit, such as current compensation units 711 and 811. In FIG. 7 and FIG. 8, the current compensation unit is connected in parallel in parallel to the first processing unit and the second processing unit. For simplification, the operation and connection of the other components with the exception of the current compensation unit are omitted in this specification.

Figure 9:
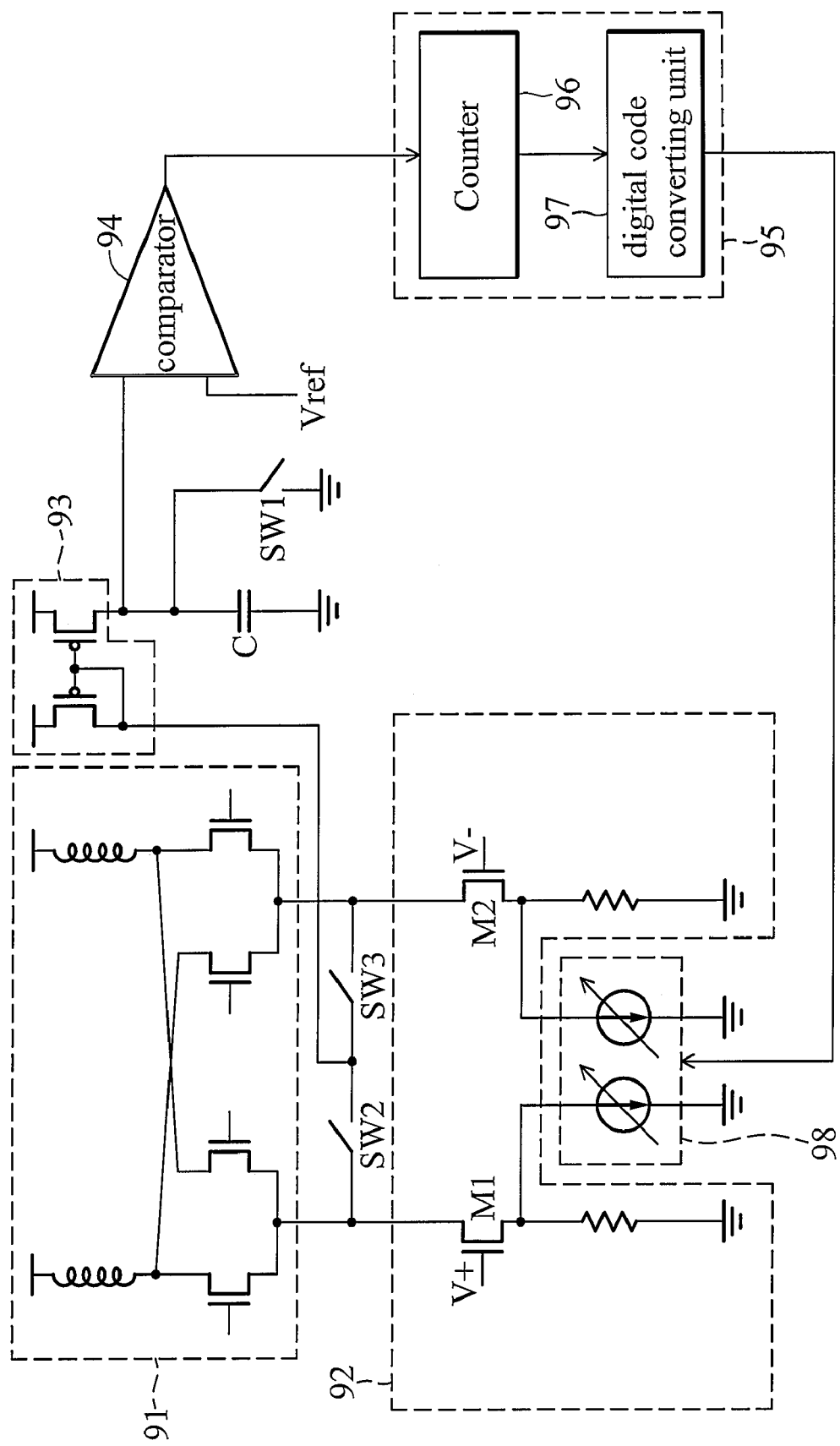
FIG. 9 is a circuit diagram illustrating another embodiment of a mixer with carrier leakage calibrating mechanism.

FIG. 9 is a circuit diagram illustrating another embodiment of a mixer with carrier leakage calibrating mechanism. The operation and connection relation in FIG. 9 are similar to FIG. 7. The only difference between them is that the gm stage 92 is a differential pair circuit directly receiving a pair of differential signals. For simplification, the operation and connection of the other components except the gm stage 92 are omitted in this specification. Those skilled in the art will understand the function and operation of the circuit of FIG. 9.

Figure 10:
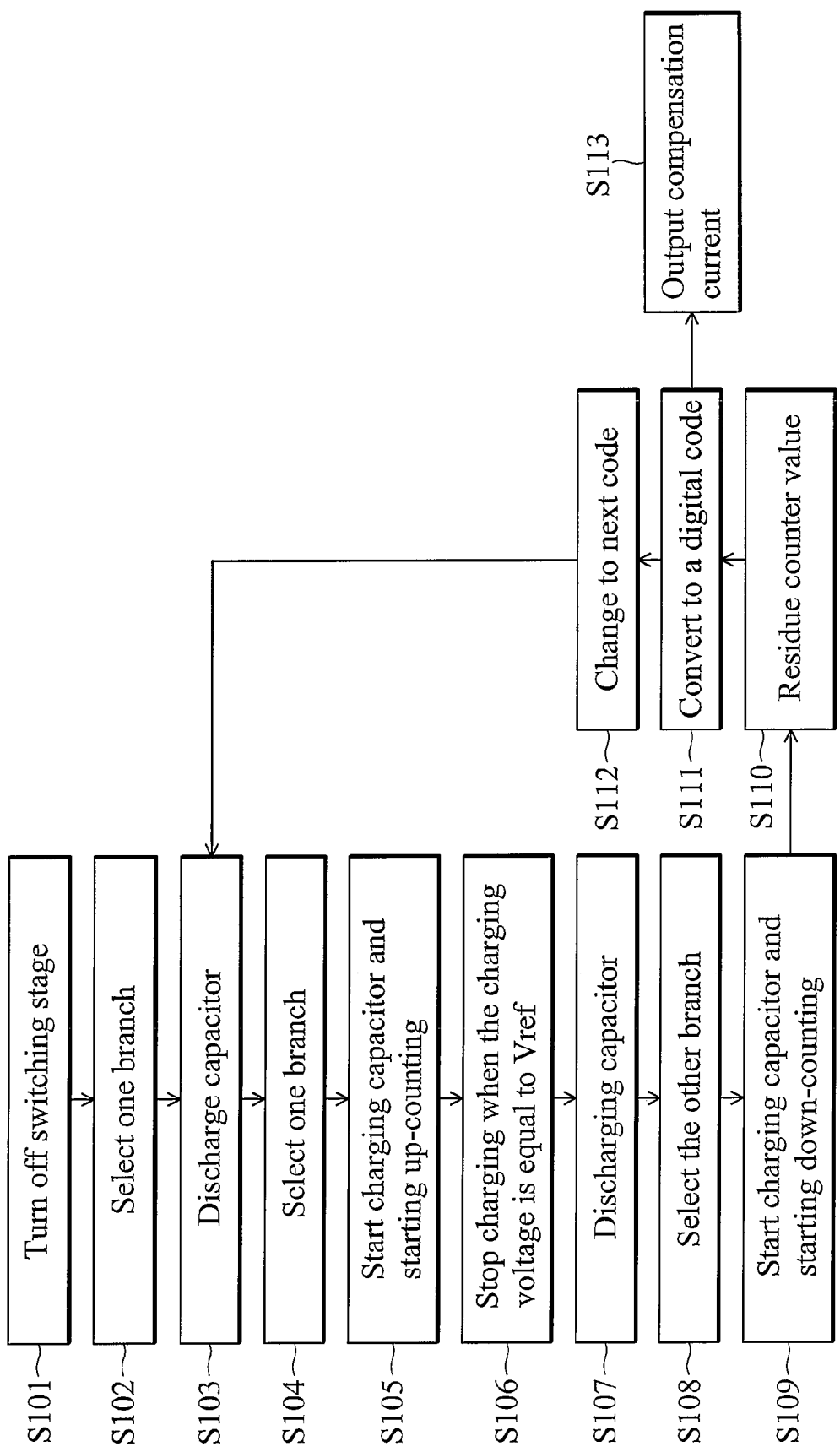
FIG. 10 is a flowchart of an embodiment of a method for calibrating carrier leakage in a mixer.

FIG. 10 is a flowchart of an embodiment of a method for calibrating carrier leakage in a mixer. The mixer comprises a switching stage and a gm stage, and the method of FIG. 10 is applied to solve the current mismatching in gm stage. In step S101, the switch stage is turned off, and an initial digital code corresponding to an initial compensation current is determined in step S102. In step S103, one branch is selected and the current passing through the selected branch is duplicated by a current duplicating unit. In this embodiment, the gm stage comprises two branches, such as two processing units as described in FIGS. 4-9. In step S105, a capacitor starts being charged by the duplicated current and a counter starts up-counting the charge time. When the voltage of the capacitor (Vc) is equal to a reference voltage Vref, the counter stop counting and acquires a count value in step S106. In step S107, the capacitor is discharged to 0V. When the capacitor is fully discharged, another branch is selected and the current passing through the selected branch is duplicated by the current duplicating unit in step S108. In step S109, the capacitor starts being charged by the duplicated current and the counter starts down-counting the charge time from the count value acquired in step S106. When the voltage of the capacitor (Vc) is equal to a reference voltage Vref, the counter stops counting and acquires a residual count value in step S110. In step S111, the residual count is converted to a digital code by a digital code converting unit. In step S113, the current compensation unit generates corresponding compensation current based on the digital code generated in step S111. Furthermore, in step S112, the initial digital code is replaced by the digital code generated in step S111.

Figure 11:
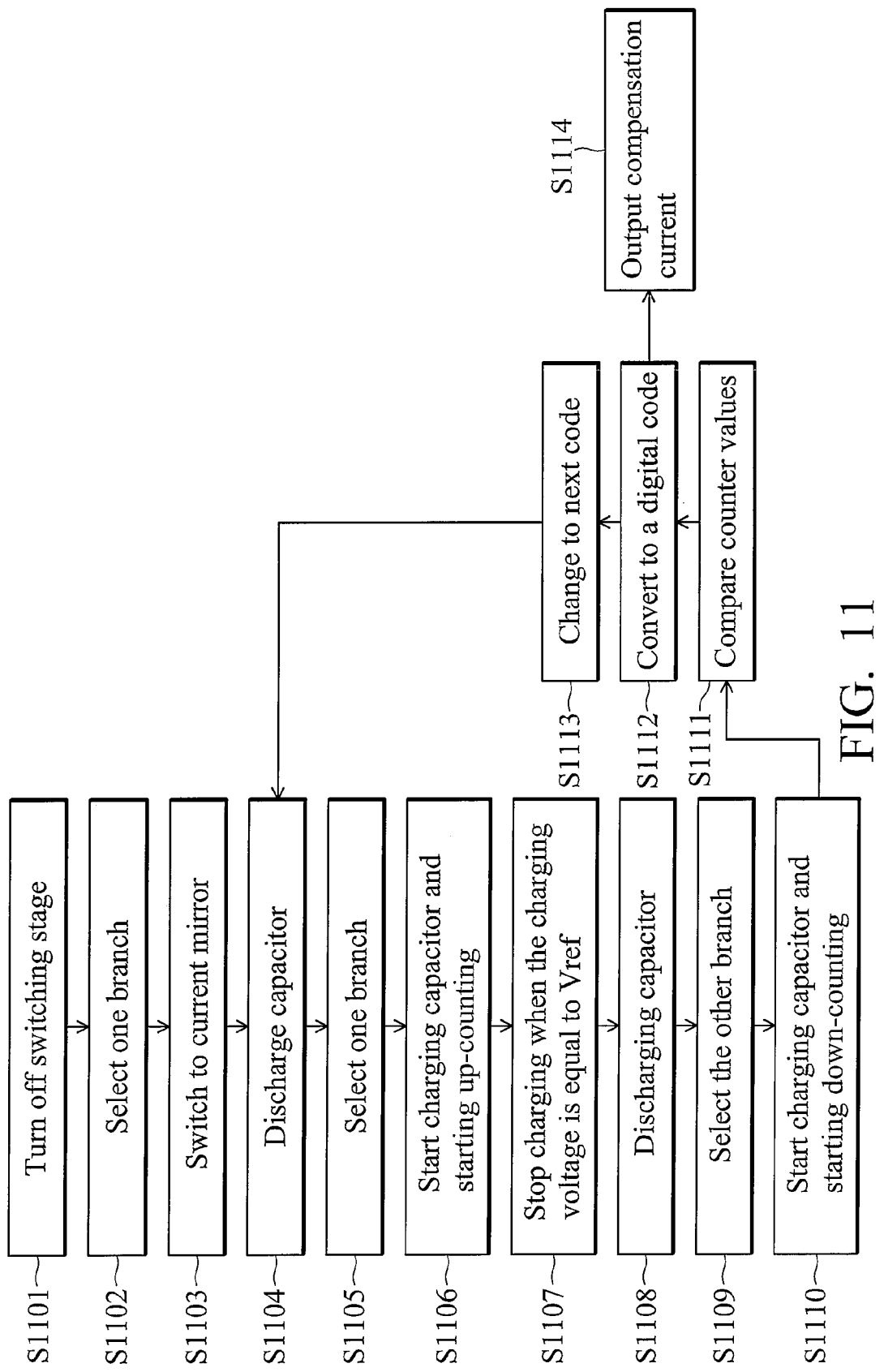
FIG. 11 is a flowchart of another embodiment of a method for calibrating carrier leakage in a mixer.

FIG. 11 is a flowchart of another embodiment of a method for calibrating carrier leakage in a mixer. The mixer comprises a switching stage and a gm stage, and the method of FIG. 11 is applied to solve the current mismatch in gm stage. In step S1101, the switch stage is turned off, and an initial digital code corresponding to an initial compensation current is determined in step S1102. In step S1103, the gm stage is switched to be coupled to a current mirror to duplicate the current of the gm stage. In step S1104, the capacitor is initially fully discharged. In step S1105, one branch is selected and the current passing through the selected branch is duplicated by the current mirror. In this embodiment, the gm stage comprises two branches, such as two processing units as described in FIGS. 4-9. In step S1106, a capacitor starts being charged by the duplicated current and a counter starts counting the first charge time. When the voltage of the capacitor (Vc) is equal to a reference voltage Vref, the counter stop counting and acquires a first count value in step S1107. In step S1108, the capacitor is discharged to 0V. When the capacitor is fully discharged, another branch is selected and the current passing through the selected branch is duplicated by the current mirror. In step S11110, charging of the capacitor by the duplicated current and the counter starts counting the second charge time. When the voltage of the capacitor (Vc) is equal to a reference voltage Vref, the counter stops counting and acquires a second count value in step S1110. In step S1111 and step S1112, a difference value between the first count value and the second count value is converted to a digital code by a digital code converting unit. In step S1114, the current compensation unit generates corresponding compensation current based on the digital code generated in step S111. Furthermore, in step S1113, the initial digital code is replaced by the digital code generated in step S1112.

Figure 12:
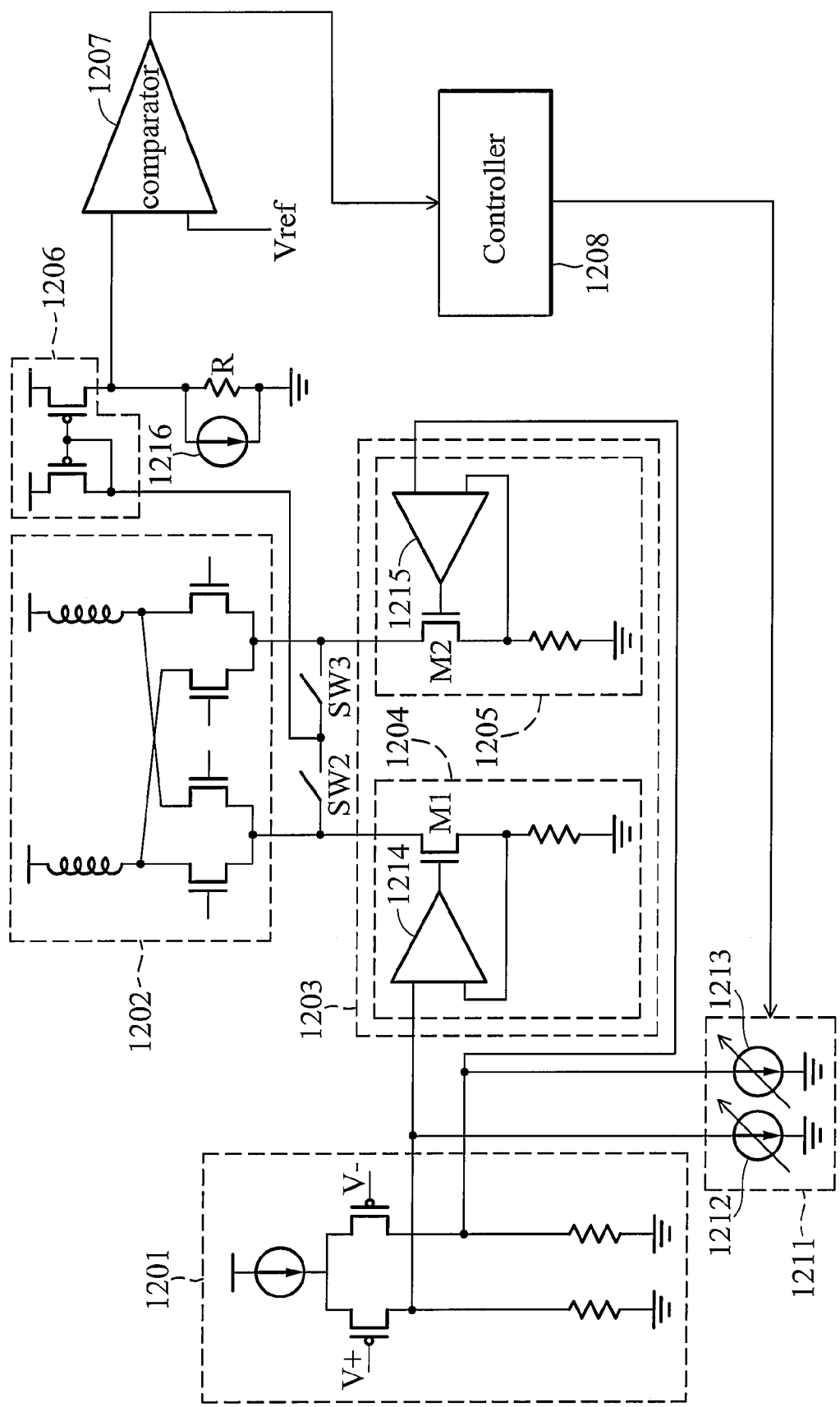
FIG. 12 is a circuit diagram illustrating another embodiment of a mixer with carrier leakage calibrating mechanism.

FIG. 12 is a circuit diagram illustrating another embodiment of a mixer with carrier leakage calibrating mechanism. The input stage 1201 generates and transmits a pair of differential signals to the gm stage 1203. The gm stage 1203 comprises a first processing unit 1204 and a second processing unit 1205. The first processing unit 1204 comprises a second comparator 1214, a first transistor M1 and a first loader (not labeled). The second comparator 1214 has a first input terminal receiving the differential signal from the input stage 1201, a second input terminal and an output terminal. The first transistor M1 has a control terminal coupled to the output terminal of the second comparator 1214, an input terminal coupled to the switching stage 1202 and an output terminal coupled to the first loader. The second processing unit 1205 comprises a second comparator 1214, a second transistor M2 and a second loader (not labeled). The third comparator 1215 has a first input terminal receiving the differential signal from the input stage 1201, a second input terminal and an output terminal. The second transistor M2 has a control terminal coupled to the output terminal of the third comparator 1215, an input terminal coupled to the switching stage 1202 and an output terminal coupled to the second loader.

A second switch SW2 has a first terminal coupled to the input terminal of the first transistor M1 and a second terminal. A third switch SW3 has a first terminal coupled to the second terminal of the second switch SW2 and a second terminal coupled to the input terminal of the second transistor M2. In this embodiment, when the carrier leakage calibrating mechanism is activated, only the second switch SW2 or the third switch SW3 is turned on. Furthermore, the switching stage 1202 is turned off in response to the carrier leakage calibrating mechanism beginning to work.

The current mirror 1206 duplicates and transmits a first current from the first processing unit 1204 or a second current from the second processing unit 1205 to the resistor R through the output of the current mirror 1206. The resistor R has a first terminal coupled to the output of the current mirror 1206 and a second terminal grounded. The first comparator 1207 has a first input terminal coupled to the output of the current mirror 1206, a second input terminal receiving a reference voltage Vref, and an output terminal coupled to a controller 1208. The first comparator 1207 compares the voltage of the output of the current mirror 1206 and the reference voltage Vref to output a comparison signal to the controller 1208. Then, the controller 1208 converts the comparison signal to a digital code that is transmitted to the current compensation unit 1211 to generate the compensation current.

The current compensation unit 1211 comprises two digital controlled current generators, a first current generator 1212 and a second generator 1213, respectively coupled to the first processing unit 1204 and the second processing unit 1205. In one example, the first current generator 1212 and the second generator 1213 are digital to analog converters (DAC). The first processing unit 1204 comprises a second comparator 1214, a first transistor M1 and a loader (not labeled). The second comparator 1214 has a first input terminal receiving the differential signal from the input stage 1201, a second input terminal and an output terminal. The first transistor M1 has a control terminal coupled to the output terminal of the second comparator 1214, an input terminal coupled to the switching stage 1202 and an output terminal coupled to the loader. The second processing unit 1205 comprises a second comparator 1214, a second transistor M2 and a second loader (not labeled). The third comparator 1215 has a first input terminal receiving the differential signal from the input stage 1201, a second input terminal and an output terminal. The second transistor M2 has a control terminal coupled to the output terminal of the third comparator 1215, an input terminal coupled to the switching stage 1202 and an output terminal coupled to the second loader. When the current compensation unit 1211 outputs the compensation current to the second comparator 1214 and the third comparator 1215, the voltage of output terminals of the second comparator 1214 and the third comparator 1215 changes and the currents passing through the first transistor M1 and the second transistor M2 also change, thus, the current mismatch between the first transistor M1 and the second transistor M2 can be reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mixer with self-calibrating carrier leakage, comprising:
    a double balanced mixer;
    a gm stage comprising a first processing unit and a second processing unit;
    a current duplicating circuit to select the first processing unit or the second processing unit and duplicate a duplicated current of the selected processing unit; and
    a current measurement circuit for respectively receiving the duplicated current to generate a compensation current based on a current difference between the currents of the first processing unit and the second processing unit, wherein the current measurement circuit comprises:
        a capacitor having a first terminal and a second terminal, wherein the second terminal is grounded and the first terminal receives the duplicated current;
        a controller determining a charge time of the capacitor to generate a compensation signal, wherein the charge time is the time that the voltage of the capacitor is charged to equal to a reference voltage; and
        a current compensation unit receiving the compensation signal to generate a compensation current to the mixer.

2. The mixer as claimed in claim 1, wherein the charge time is a first charge time that the voltage of the capacitor is charged to equal to a reference voltage by a first current of the first processing unit, or a second charge time that the voltage of the capacitor is charged to equal to a reference voltage by a second current of the second processing unit.

3. The mixer as claimed in claim 2, wherein the compensation signal is determined based on a difference between the first charge time and the second charge time.

4. The mixer as claimed in claim 1, further comprising a first comparator having a first input terminal coupled to the first terminal of the capacitor, a second input terminal receiving a reference voltage, and an output terminal coupled to the controller.

5. The mixer as claimed in claim 4, wherein the first comparator outputs a start-counting signal to the controller in response to the capacitor being fully discharged, and outputs a stop-counting signal to the controller in response to the capacitor being fully charged.

6. The mixer as claimed in claim 5, wherein the controller further comprises a counter operating based on a clock signal to output a count value and the compensation signal is determined based on the count value.

7. The mixer as claimed in claim 6, the controller further comprising a digital code converting unit to output a digital code based on the count value.

8. The mixer as claimed in claim 4, further comprising a switching device having a first terminal coupled to the first terminal of the capacitor, and a second terminal coupled to the second input terminal of the first comparator in response to the capacitor being charged or grounded in response to the capacitor being discharged.

9. The mixer as claimed in claim 1, further comprising a current generating unit connected in connected in parallel to the capacitor.

10. The mixer as claimed in claim 1, wherein the current compensation unit comprises a first current compensation unit and a second current compensation unit respectively compensates the currents of the first processing unit and the second processing unit.

11. The mixer as claimed in claim 10, wherein the first current compensation unit and the second current compensation unit are respectively connected in parallel to the first processing unit and the second processing unit.

12. The mixer as claimed in claim 10, wherein the first processing unit comprises:
   a first transistor having an input terminal coupled to the mixer, a control terminal and an output terminal; and
   a second comparator having a first input terminal receiving a first differential input signal, a second input terminal coupled to the output terminal of the first transistor, and an output terminal coupled to the control terminal of the first transistor.

13. The mixer as claimed in claim 12, wherein the first current compensation unit is coupled to the first input terminal of the second comparator and injects the compensation current into the second comparator.

14. The mixer as claimed in claim 12, wherein the first current compensation unit is connected in parallel to the first processing unit.

15. The mixer as claimed in claim 10, wherein the second processing unit comprises:
   a second transistor having an input terminal coupled to the mixer, a control terminal and an output terminal; and
   a third comparator having a first input terminal receiving a second differential input signal, a second input terminal coupled to the output terminal of the second transistor, and an output terminal coupled to the control terminal of second first transistor.

16. The mixer as claimed in claim 15, wherein the second current compensation unit is coupled to the first input terminal of the third comparator and injects the compensation current into the third comparator.

17. The mixer as claimed in claim 15, wherein the second current compensation unit is connected in parallel to the second processing unit.

18. The mixer as claimed in claim 1, wherein the current duplicating circuit is a current mirror.

19. The mixer as claimed in claim 1, further comprising a selecting device coupled to the first processing unit and the second processing unit to make an electrical connection between the current duplicating circuit and one of the first processing unit and the second processing unit.

20. The mixer as claimed in claim 19, wherein the selecting device comprises two switches.

21. The mixer as claimed in claim 1, further comprising an input stage to provide differential input signals to the gm stage.

22. A mixer with self-calibrating carrier leakage, comprising:
   a double balanced mixer;
   a gm stage comprising a first processing unit and a second processing unit;
   a current duplicating circuit to select the first processing unit or the second processing unit and duplicate a duplicated current of the selected processing unit; and
   a current measurement circuit for respectively receiving the duplicated current to generate a compensation current based on a current difference between the currents of the first processing unit and the second processing unit, wherein the current measurement circuit comprises:
   a resistor having a first terminal couple to the current duplicating circuit and a second terminal grounded; and
   a comparator having a first input terminal coupled to the first terminal of the resistor, a second input terminal receiving a reference voltage, and an output terminal outputting a voltage difference.

23. The mixer as claimed in claim 22, further comprising a current compensation unit to generate a compensation current to the mixer based on the voltage difference.

24. The mixer as claimed in claim 22, further comprising a controller receiving and converting the voltage difference to a digital code.

25. The mixer as claimed in claim 24, further comprising a digital to analog converter receiving and converting the digital code to a compensation current to the mixer.

26. A method for calibrating carrier leakage in a mixer, wherein the mixer comprises a switching stage and a gm stage, comprising:
   turning off the switching stage;
   initializing a carrier leakage detection unit;
   duplicating a duplicated current from the gm stage;
   charging a capacitor by the duplicated current;
   determining a first charge time that the capacitor is charged to the reference voltage by a first current of the first processing unit, and a second charge time that the capacitor is charged to the reference voltage by a second current of the second processing unit;
   determining a compensation current based on a difference between the first charge time and the second charge time.

27. The method as claimed in claim 26, wherein the step of initializing a carrier leakage detection unit comprises discharging the capacitor.

28. The method as claimed in claim 27, further comprising determining an initial charge time and the compensation current being determined based on a difference between the charge time and the initial charge time.

29. The method as claimed in claim 26, wherein the gm stage comprises a first processing unit and a second processing unit.

* * * * *